United States Patent [19]
Edwin et al.

[11] Patent Number: 5,178,318
[45] Date of Patent: Jan. 12, 1993

[54] MULTILAYER RIGID-FLEX PRINTED CIRCUIT BOARDS FOR USE IN INFRARED REFLOW OVEN AND METHOD FOR ASSEMBLING SAME

[75] Inventors: Eric R. Edwin; James J. Tumlinson, both of Tomball; Jerome A. Wilson, Houston; Thad C. McMillan, Jr., Spring; Rollin G. Meyer, Hockley, all of Tex.; Darryl J. McKenney, Milford, N.H.

[73] Assignee: Compaq Computer Corp., Houston, Tex.

[21] Appl. No.: 711,331

[22] Filed: Jun. 6, 1991

Related U.S. Application Data

[62] Division of Ser. No. 596,479, Oct. 12, 1990.

[51] Int. Cl.⁵ .............................................. H05K 3/34
[52] U.S. Cl. .................................. 228/180.2; 228/214; 228/222
[58] Field of Search ................. 228/180.2, 248, 214, 228/222; 174/254

[56] References Cited

U.S. PATENT DOCUMENTS

| | | | |
|---|---|---|---|
| 3,409,732 | 11/1968 | Dahlgren et al. | 174/68.5 |
| 4,075,420 | 2/1978 | Walton | 174/254 X |
| 4,424,095 | 1/1984 | Frisch et al. | 29/852 X |
| 4,800,461 | 1/1989 | Dixon et al. | 361/398 |
| 4,838,475 | 6/1989 | Mullins et al. | 228/180.2 X |
| 4,885,841 | 12/1989 | McNabb | 29/834 |
| 4,965,227 | 10/1990 | Chang et al. | 174/50.51 X |
| 4,998,342 | 3/1991 | Bonnell et al. | 228/180.2 X |
| 5,048,166 | 9/1991 | Wakamatsu | 228/180.2 |
| 5,072,074 | 12/1991 | Demaso et al. | 174/254 |

Primary Examiner—Samuel M. Heinrich
Attorney, Agent, or Firm—Pravel, Gambrell, Hewitt, Kimball & Krieger

[57] ABSTRACT

A rigid-flex printed circuit board having a rigid section and a flexible section extending from the rigid section is disclosed. The rigid-flex printed circuit board is capable of withstanding high temperatures experienced in high volume production environments utilizing infrared reflow ovens by providing spacers and covers for protecting the flexible section from high temperatures. A process for assembling components and devices on the rigid-flex printed circuit board in a high volume production environment utilizing infrared reflow ovens is also disclosed.

4 Claims, 2 Drawing Sheets

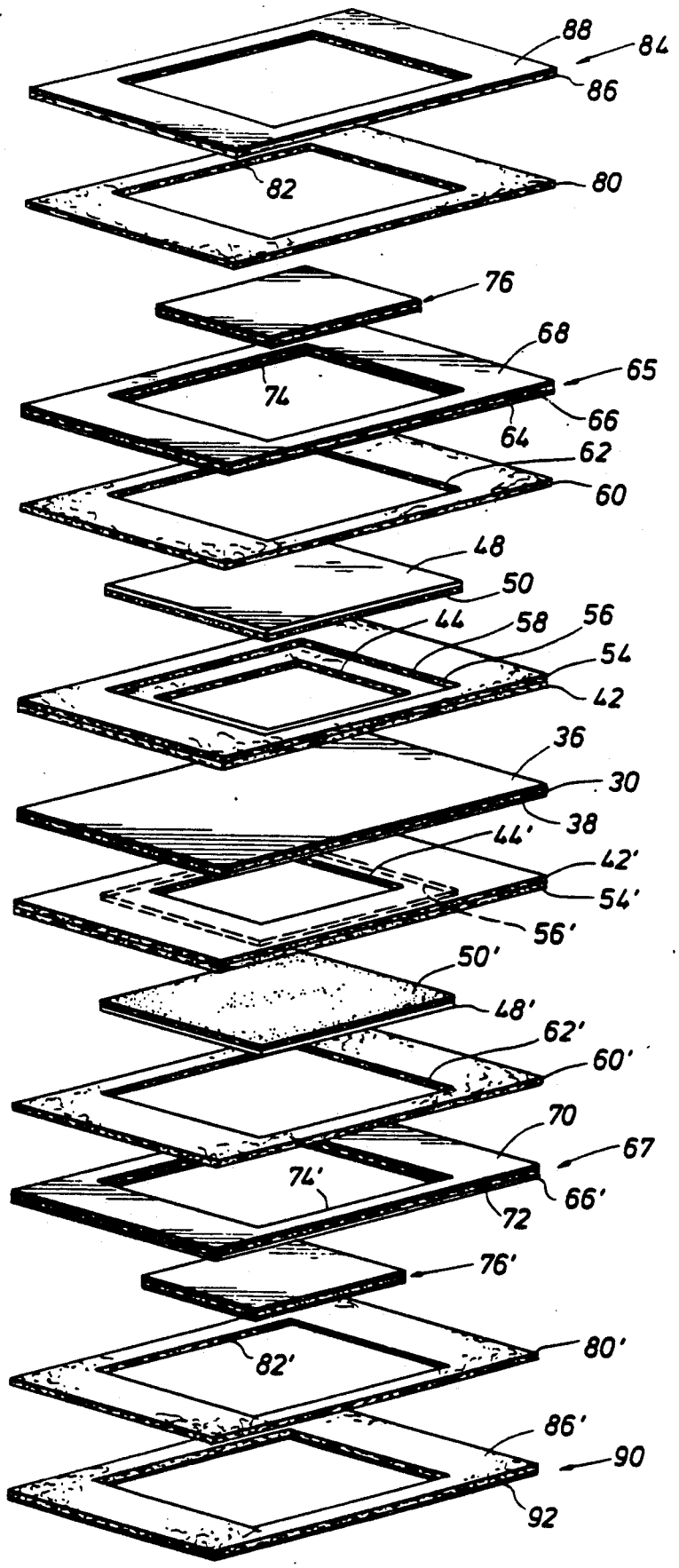

MULTILAYER RIGID-FLEX PRINTED CIRCUIT BOARDS FOR USE IN INFRARED REFLOW OVEN AND METHOD FOR ASSEMBLING SAME

This is a division of application Ser. No. 596,479 filed Oct. 12, 1990.

BACKGROUND OF THE INVENTION

1. Field of the Invention

The present invention relates to multilayer rigid-flex printed circuit boards for use with an infrared reflow oven and a method for assembling same. More particularly, the present invention includes an improved structure which enables the rigid-flex printed circuit boards to withstand the high temperatures of an infrared reflow oven which is used for assembling circuits in a high volume production environment.

2. Description of the Related Art

The techniques of fabricating multilayer rigid-flex printed circuit boards are well known in the field. An early example of the prior art is disclosed in U.S. Pat. No. 3,409,732. Typically, a rigid-flex printed circuit board includes flexible sections of the printed circuit board extending from the periphery of the rigid section or sections. The rigid sections of the printed circuit boards are typically used as sites for electronic components or mechanical hardware. The printed circuit board may consist of several conductor layers which are separated by insulator layers. The conductor layer is fabricated from one continuous sheet of copper foil which is etched to form the conductor patterns or traces.

As a result of electronic packaging needs, more complex multilayer rigid-flex printed circuit boards using up to 25, or even more, conductor layers have come about. The various conductor layers are separated by layers of insulation. The various conductor layers are electrically connected by vias, or copper conductor barrels, formed in the rigid section of the circuit board through the layers of conductors and insulation. The rigid-flex printed circuit boards having many layers experienced certain problems when subjected to high temperatures. One problem resulted from the thermal expansion of the rigid section of the circuit board in the Z-direction, or thickness, resulting in fractured conductor barrels. A second problem associated with high temperatures was delamination of the rigid board section resulting from volatized absorbed moisture which was entrapped in the circuit board.

U.S. Pat. No. 4,800,461 to Dixon, et al. disclosed a multilayer rigid-flex printed circuit board which eliminated materials from the rigid section which caused the undesirable expansion in the Z-direction, and which absorbed excessive amounts of moisture. The complete disclosure of U.S. Pat. No. 4,800,461 is hereby incorporated by reference and made a part of this application. In Dixon, et al., the rigid section of the printed circuit board does not contain the troublesome materials, those being acrylic adhesive and KAPTON, because the flexible sections which include Kapton and acrylic adhesive only extend to, but not substantially into, the rigid section. Of course, the Kapton and acrylic layers can extend an insubstantial distance into the rigid section without causing undue problems. Subjecting the circuit boards of Dixon, et al. to hot solder reflow does not cause differential expansion and contraction leading to cracking of the copper plated through barrels or delamination of the layers. Additionally, extended baking times at temperatures on the order of 250° F., often as long as 48 hours, to remove moisture from the Kapton and acrylic layers are avoided.

Although U.S. Pat. No. 4,800,461 solved the temperature-related problems associated with the rigid section of the board, the solution did not consider the adverse effects of high temperatures on the flexible section of the rigid-flex printed circuit board. The rigid-flex printed circuit board of U.S. Pat. No. 4,800,461 was utilized in the assembly of circuits in a low volume production environment in which the electrical components are manually soldered and only isolated areas of the rigid board were subjected to concentrated heating and thus elevated temperatures. Additionally, this circuit board was used with certain high volume production assembly processes such as wave soldering and vapor phase soldering which also did not result in sustained, elevated temperatures in the flexible materials.

In a high volume production environment utilizing infrared reflow ovens, entire circuit boards are passed through the oven which elevates the temperature across the entire board, both the rigid and flexible sections of the board. A major problem that arises when a rigid-flex printed circuit board is soldered in an infrared reflow oven is that the flexible portion of the board cannot withstand the elevated temperatures of the heat panels in the oven. As a result, the flexible section of the board will degrade by delaminating. The infrared reflow ovens, commonly referred to as IR ovens, heat by natural convection and infrared energy. The heating panels in the IR oven may reach temperatures of 430° C. The flexible section of the printed circuit board begins to degrade at approximately 275° C. The degradation of the flexible portion of the board will adversely affect the integrity of the entire printed circuit board. Consequently, there is a need for a rigid-flex printed circuit board which can be used in high-volume production environments utilizing infrared reflow ovens without damaging the integrity of the flexible portion of the circuit board.

SUMMARY OF THE INVENTION

Briefly, the invention is a simple and unique structure and method for assembling a multilayer rigid-flex printed circuit board for high volume production environments utilizing IR ovens. A multilayer rigid-flex printed circuit board comprised of multiple conductor layers separated by insulating layers is laminated together in the usual process. A slug and a cover made out of insulating material is incorporated in the insulating layers of the printed circuit board and are located above and below the flexible section. The slug and cover shield the flexible section from excessive temperatures such as those experienced in infrared reflow ovens. After soldering the components or devices to the rigid-flex printed circuit board in the IR oven, the cover and slug are removed from above and below the flexible section.

BRIEF DESCRIPTION OF THE DRAWINGS

In order that the features of this invention may be better understood, a detailed description of the invention, as illustrated in the attached drawings, follows.

FIG. 2 is an exploded view of portions of the sheet materials used to form the layers of the present invention.

DETAILED DESCRIPTION OF THE INVENTION

The manufacture of a combined multilayer rigid-flex printed circuit board, commonly referred to as rigid-flex PCB, is well known to those skilled in the art.

Figure 1:
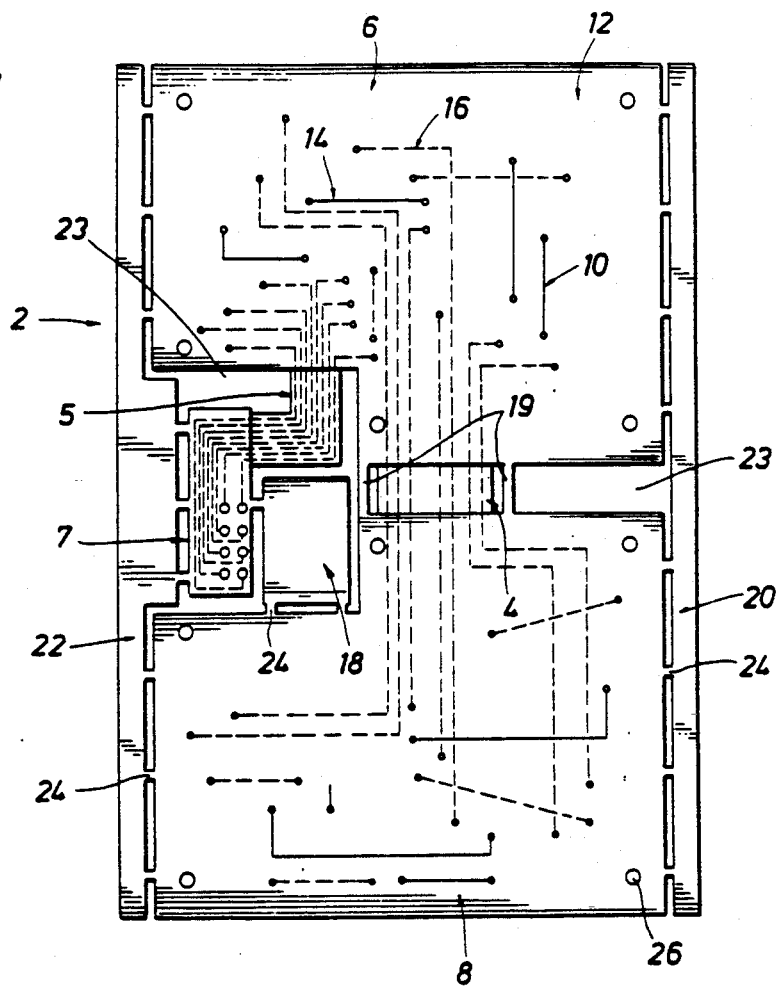
FIG. 1 is a top view of a representative configuration of the present invention showing the conductor traces of the various conductor layers.

FIG. 1 shows a rigid-flex PCB 2 having a first flexible section 4 joining a right rigid section 6 and a left rigid section 8 and a second flexible section 5 joining the right rigid section 6 to a small rigid section 7. The second flexible section 5 is L-shaped to permit the rigid section 7 to be oriented in a desired final configuration. The flexible sections and rigid sections can take on a multitude of shapes and configurations and the shapes and configurations in FIG. 1 are for illustration only. A conductor pattern or trace 10 in a top conductor layer 12 of the rigid-flex PCB 2 is shown by a solid line 14 whereas traces 10 in a layer other than the top layer 12 are shown by dashed lines 16. The PCB 2 has breakaway rigid sections 18, 19, 20, and 22 which are removed after assembly of the components on the rigid-flex PCB 2. The breakaway rigid sections 18, 19, 20, and 22 provide needed stiffness and rigidity to the PCB 2 since the PCB 2 has open areas 23 between the various rigid sections 6, 7, and 8 which are connected by flexible sections 4 and 5. This stiffness and rigidity is required to facilitate the placement of the components on the PCB 2 and is also required during the process of soldering the components to the PCB 2 as will be explained below. The breakaway rigid sections 18, 19, 20, and 22 are connected to the rigid sections 6, 7, and 8 by tabs 24 which can be easily snapped or broken after assembly of the components onto the rigid-flex PCB 2. After the tabs 24 have been snapped, the rigid-flex PCB 2 can be folded to a final compact configuration. For example, the rigid-flex PCB 2 illustrated in FIG. 1 is designed to fold the right rigid section 6 over the left rigid section 8 or vice versa. The right and left sections 6 and 8 do not make electrical contact with each other except via the flexible section 4 unless other electrical connectors are provided. The separation between the right and left sections 6 and 8 may be maintained by various means. For example, the separation of the right and left sections 6 and 8 of the PCB 2 in FIG. 1 can be accomplished by placing a spacer (not shown) between the sections 6 and 8 and connecting the sections 6 and 8 to the spacer by inserting a fastener (not shown) through a hole 26 in the PCB 2 and connecting the fastener to the spacer.

Figure 3:
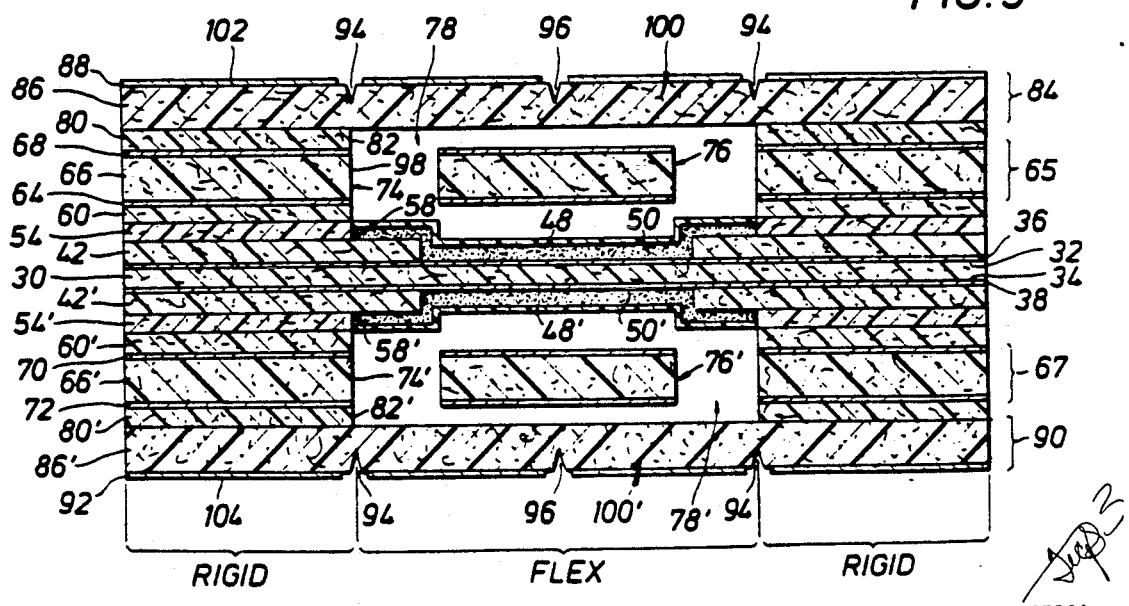
FIG. 3 is a sectional view of the present invention showing the rigid-flex-rigid interface with the slugs and covers and enlarged in the interests of clarity.

With reference to FIGS. 2 and 3, the rigid-flex PCB 2 is shown having a core insulator layer 30 preferably comprised of a fiberglass sheet impregnated with an adhesive such as epoxy, commonly referred to as prepreg. The insulator layer 30 and all the subsequent layers of conductors and insulators which make up the printed circuit board 2 have the general shape and outline of the printed circuit board 2 (as shown in FIG. 1) during the lamination process with the exception of certain layers which are explained below. The insulator layer 30 is laminated by means of adhesive or other bonding material on its upper and lower surfaces 32 and 34 with conductor layers 36 and 38. The conductor layers 36 and 38 are preferably comprised of copper sheets. The copper sheets 36 and 38 are imaged and etched to provide the conductor patterns or traces 10 as shown in FIG. 1. As disclosed in U.S. Pat. No. 4,800,461, the exposed copper traces 10 are then treated to enhance bondability of the epoxy prepreg 30 to the copper traces 10, for example, by the black oxide process typically used in the rigid board field.

Two additional insulator prepreg sheets 42 and 42', each having a cutout 44 and 44', are positioned on each outer surface of the conductor layers 36 and 38. The cutouts 44 and 44' are such that the prepreg sheets 42 and 42' extend slightly into the flexible sections 4 and 5 of the PCB 2. A flexible insulator 48, typically of KAPTON, a trademark of E. I. du Pont de Nemours & Company, is covered with a layer of a suitable adhesive 50; for example, an acrylic adhesive which provides excellent binding of KAPTON to copper. The adhesive layer 50 and KAPTON insulator layer 48 are positioned on the exposed surface of the conductor layer 36 and slightly overlap the outer surface of the prepreg sheet 42. A similar sheet of KAPTON 48' covered with a layer of adhesive 50' is similarly located on the opposite face of the flexible section. As shown in FIG. 3, the KAPTON sheets 48 and 48' and their associated adhesive layers 50 and 50' are slightly longer than the length of the cutouts 44 and 44' in the prepreg sheets 42 and 42' to overlap slightly the sheets 42 and 42' by, for example, 0.050 inch. Insulator layers such as KAPTON and acrylic adhesives afford excellent flexibility and tear resistance characteristics to the flexible sections 4 and 5.

Referring to FIGS. 2 and 3, prepreg sheets 54 and 54', each having cutouts 56 and 56' are next laminated to the PCB 2. The cutouts 56 and 56' in the prepreg sheets 54 and 54' are slightly larger than the cutouts 44 and 44' and are coextensive with the KAPTON layers 48 and 48', so that the KAPTON layers 48 and 48' abut the edges 58 and 58' of the prepreg sheets 54 and 54'.

The next lamination to be added to each side of the PCB 2 is prepreg sheet 60 and 60', each having a cutout 62 and 62'. The prepreg sheets 60 and 60' are the same shape as prepreg sheets 54 and 54'.

The next lamination to be added to the printed circuit board 2 is a composite lamination 65 consisting of three sheets: a laminate layer 66 having copper sheets 64 and 68 below and above the laminate layer 66. The laminate layer 66 is preferably a fiberglass resin standard printed circuit board material commonly known as FR4. A similar composite lamination 67 comprised of a laminate layer 66' having conductor sheets 70 and 72 is located on the opposite surface of the PCB 2. The composite laminations 65 and 67 each have a cutout 74 and 74' and are the same shape as prepreg sheets 60 and 60' and 54 and 54'. The copper or conductor sheets 64, 68, 70, and 72 have appropriate conductor paths as necessary to develop the circuitry of the PCB 2.

A spacer or slug 76 is formed out of the material remaining from the cutout 74 from the composite lamination 65. The slug 76 is trimmed so that the slug 76 is approximately 0.125 inches less in length than the length of the cutout 74. A similar slug 76' is formed out of the material remaining from the cutout 74' from the other composite lamination 67. The slugs 76 and 76' are inserted in the cutouts 62, 62', 74 and 74' of the prepreg sheets 60 and 60' and the composite laminations 65 and 67. The slugs 76 and 76' are allowed to "float" within the pockets 78 and 78' formed by the cutout areas.

The next layer to be added to the outer surfaces of the circuit board 2 are prepreg sheets 80 and 80', each having a cutout 82 and 82'. The prepreg sheets 80 and 80' are the same size and shape as prepreg sheets 60 and 60'.

The top and bottom layers of the printed circuit board 2 are comprised of a two sheet composite lamination. The top composite lamination 84 includes a laminate layer 86 and a conductor sheet 88. The bottom composite lamination 90 includes a laminate layer 86' and a conductor sheet 92. The top and bottom composite laminations 84 and 90 contain outer scribe marks 94 and a center scribe mark 96. The outer scribe marks 94 are aligned with the sidewalls 98 of the pockets 78 and 78'. The area of the top composite lamination 84 between the outer scribe marks 94 constitutes a top cover 100 for a flexible section and the corresponding area on the bottom composite lamination 90 constitutes a bottom cover 100'. The center scribe mark 96 is preferably located approximately mid-way between the outer scribe marks 94. The scribe marks 94 and 96 are not absolutely required, but do assist in removing the covers 100 and 100' after the rigid-flex PCB 2 has passed through the IR ovens.

Referring to FIG. 3, the cover 100 and slug 76 protect the flexible section from above and the cover 100' and slug 76' protect the same from below. The copper sheet 88 on the top cover 100 and the copper sheets 64 and 68 on the slug 76 provide additional insulating protection to the flexible section and the same is true for the bottom cover 100' and the slug 76'. As shown in FIG. 3, the slugs 76 and 76' "float" in the pockets 78 and 78' and the air spaces surrounding the slugs 76 and 76' further insulate the flexible sections from the heat in the IR oven.

The process of assembling the rigid-flex PCB 2 in a high volume production environment in which the rigid-flex PCB 2 is passed through IR ovens will now be explained. Typically, a rigid-flex PCB 2 as shown in FIG. 1 will have devices and components soldered to a top surface 102 and a bottom surface 104 of the rigid section of the PCB 2. Beginning with the top surface 102, a screen printer applies or screens solder powder or paste on the top surface 102 of the PCB 2 at the locations to which a component or device will be soldered. The components or devices are then placed on the solder paste. The PCB 2 with components and solder paste is then passed through the IR oven.

The IR oven has a series of heat panels located above and below a conveyor. An upper heat panel located directly above a lower heat panel make up a zone. An oven with 20 heat panels, ten above and ten below the conveyor, is called a ten zone oven. As the PCB 2 enters the oven, the first few zones make up a preheat stage. Heating the PCB 2 from both above and below is required to prevent any warping of the PCB 2. Thus, slugs 76 and 76' and covers 100 and 100' are required on both sides of a flexible section, regardless of whether or not components or devices are being soldered to both surfaces 102 and 104 of the rigid-flex PCB 2. The preheat stage is also required to prevent "shocking" the components by subjecting them to sudden temperature extremes. The zone temperature in the preheat stage may range from 300° to 350° C. The PCB 2 then passes through an exhaust stage of the oven to permit undesirable gases to escape. The temperature of the PCB 2 after leaving the preheat stage is approximately 120°-140° C. in the preferred process. The temperature of the PCB 2 in the exhaust stage remains relatively constant.

After the exhaust stage, the PCB 2 is passed through a series of zones which are used to apply heat at a gradually increasing rate. The heat panels are adjusted to a temperature where the heat can evenly soak into the PCB 2. The object in this stage is to have all portions of the board at a consistent temperature just prior to achieving reflow of the solder at approximately 183° C. Reflow occurs in the last zones before exiting the oven. The heat panel settings in the reflow zone, or spike zone, are considerably higher than in the other zones. The IR ovens produce approximately 60% of the heat by natural convection energy and the remaining 40% is generated by infrared energy. The melting point of solder having a 63/37 ratio of tin to lead is 183° C. During the reflow process, it is normally desirable for the PCB 2 to reach temperatures of 205°-225° C.

To obtain the desired temperature ranges for the PCB 2 in the various stages of the IR oven while attempting to minimize the amount of time required for passing the PCB 2 through the oven, heat panels in the various zones may range from 200°-430° C. depending on the particular stage of the oven. The flexible material begins to delaminate at approximately 275° C. Furthermore, the flexible material, being thinner and having less mass than the rigid section of the PCB 2, heats more rapidly and peaks at higher temperatures than the rigid section of the PCB 2. Thus, heat panels at a temperature of 275° C. and above are very likely to cause the flexible material to delaminate if left unprotected.

The same procedure is employed in soldering the components or devices on the bottom surface 104 of the rigid-flex PCB 2. It should be noted that the components which have been soldered on the top surface 102 are now located on the lower side of the PCB 2 when the components on the top surface 102 are being soldered. Since the PCB 2 is being heated from both above and below, the soldered components on the top surface 102 will again be subjected to the reflow stage of the oven and the solder will again melt. The surface tension of the melted solder will oppose the gravitational force acting on the components; however, heavier components may require that an adhesive be placed on the top surface 102 of the PCB 2 prior to original placement of the heavier components.

After the components have been soldered to the bottom surface 104 of the PCB 2, the covers 100 and 100' may be removed. The preferred method is the use of a controlled depth shearing technique where the covers 100 and 100' are punched out using a punch which has edges limited in depth to prevent contact with the flexible material. Another technique uses a scoring knife which is run along the center scribe mark 96. The slug 76 beneath the cover 100 prevents the scoring knife from damaging the flexible material. After scoring the cover 100, the cover halves can be bent upwards. The outer scribe marks 94 weaken the top composite lamination 84 and cause the cover 100 to break at the outer scribe marks 94 upon bending. The halves of the cover 100 can then be removed and discarded. An alternative method of removing the cover 100 is by using a controlled depth routing process in which a router is run along the outer edge of the cover 100. After the cover 100 has been removed, the floating slug 76 will fall away. The same methods can be used to remove cover 100' and slug 76'. After this process, the breakaway rigid sections can be removed and the rigid sections can be folded to their desired configuration.

As noted above, the embodiment as shown in FIGS. 1, 2, and 3 may include any number of stacked layers of rigid insulators in combination with conductor layers to form a multilayered rigid-flex printed circuit board 2 in accordance with this disclosure. The flexible section can take on a variety of sizes and shapes. Furthermore, the number of conductor layers in the flexible section is also variable.

The foregoing disclosure and description of the invention is illustrative and explanatory thereof, and various changes in the size, shape, and materials, as well as in the details of the illustrative construction and assembly, may be made without departing from the spirit of the invention.

We claim:

1. A process for assembling components and devices on a rigid-flex printed circuit board in a high volume production environment utilizing an infrared reflow oven wherein rigid-flex printed circuit board includes a rigid section, a flexible section extending from the rigid section, a top spacer and a top insulating cover spaced above the flexible section, and a bottom spacer and a bottom insulating cover spaced below the flexible section, comprising the steps of:

screening solder paste to selected areas on a top surface of the printed circuit board;

placing components and devices on the selected areas on the top surface of the printed circuit board;

soldering the components and devices on the top surface of the printed circuit board in the infrared reflow oven; and removing the top insulating cover and the bottom insulating cover from the printed circuit board.

2. The process according to claim 1, further comprising the step of:

removing the top spacer and the bottom spacer from the printed circuit board.

3. A process for assembling components and devices on a rigid-flex printed circuit board in a high volume production environment utilizing an infrared reflow oven wherein the rigid-flex printed circuit board includes a rigid section, a flexible section extending from the rigid section, a top spacer and a top insulating cover spaced above the flexible section, and a bottom spacer and a bottom insulating cover spaced below the flexible section, comprising the steps of:

screening solder paste to selected areas on a top surface of the printed circuit board;

placing components and devices on the selected areas on the top surface of the printed circuit board;

soldering the components and devices on the top surface of the printed circuit board in the infrared reflow oven; and turning the printed circuit board over so that a bottom surface is facing upwards;

screening solder paste to selected areas on the bottom surface of the printed circuit board;

placing components and devices on the selected areas of the bottom surface of the printed circuit board;

soldering the components and devices on the bottom surface of the printed circuit board in the infrared reflow oven; and removing the top insulating cover and the bottom insulating cover from the printed circuit board.

4. The process according to claim 3, further comprising the step of:

removing the top spacer and the bottom spacer from the printed circuit board.

* * * * *